United States Patent
Jain

(10) Patent No.: US 7,451,375 B2
(45) Date of Patent: Nov. 11, 2008

(54) DIRECTED FALSIFICATION OF A CIRCUIT

(75) Inventor: Jawahar Jain, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 710 days.

(21) Appl. No.: 10/996,710

(22) Filed: Nov. 22, 2004

(65) Prior Publication Data

US 2005/0149837 A1    Jul. 7, 2005

Related U.S. Application Data

(60) Provisional application No. 60/523,902, filed on Nov. 20, 2003.

(51) Int. Cl.
*H03M 13/00* (2006.01)
(52) U.S. Cl. .................. 714/752; 714/30; 716/4; 716/5; 716/17
(58) Field of Classification Search .......... 714/752, 714/30; 716/4–5, 17
See application file for complete search history.

(56) References Cited

U.S. PATENT DOCUMENTS

| | | | |
|---|---|---|---|
| 6,212,669 B1 * | 4/2001 | Jain ............ | 716/7 |
| 7,281,225 B2 * | 10/2007 | Jain et al. ......... | 716/5 |
| 2004/0093571 A1 * | 5/2004 | Jain et al. ......... | 716/5 |

OTHER PUBLICATIONS

Biere et al., "Symbolic Model Checking without BDDs," Lecture Notes in Computer Science, 1579:193-207, 18 pages, Jan. 4, 1999.
Bloem et al., "Symbolic Guided Search for CTL Model Checking," In DAC, 6 pages, 2000.
Boppana et al., "Model Checking Based on Sequential ATPG. In ICCAD," pp. 418-430. Springer-Verlag, 11th International Conference, Jul. 6-10, 1999.
Bryant, "Graph-based Algorithms for Boolean Function Manipulation," IEEE Transactions Computers, C-35-8, 677-691, 29 pages, 1986.
Clarke et al., "Design and Synthesis of Synchronization Skeletons Using Branching Time Temporal Logic," In Proc. IBM Workshop on Logics of Programs, vol. 131 of LNCS, pp. 52-71, Springer-Verlag, 1981.
Coudert et al. "Verification of Sequential Machines Based on Symbolic Execution," In Proc. of the Workshop on Automatic Verification Methods for Finite State Systems, Grenoble, France, 1989.
Garavel et al., "Parallel State Space Construction for Model-Checking," In SPIN workshop on model checking of software, pp. 217-234, Springer-Verlag New York, Inc., 2001.

(Continued)

*Primary Examiner*—Guy J Lamarre
(74) *Attorney, Agent, or Firm*—Baker Botts L.L.P.

(57) ABSTRACT

In one embodiment, a method for directed falsification of a circuit includes selecting a partition of a state space of the circuit. The partition includes only a portion of the state space and is selected according to one or more results of one or more preimage calculations indicating one or more characteristics of the circuit. The characteristics indicate a likelihood that the partition includes one or more errors in the circuit. The method further includes, using one or more partitioned ordered binary decision diagrams (POBDDs), analyzing the partition according to a falsification-based forward-reachability technique to determine whether the partition includes one or more errors in the circuit.

21 Claims, 1 Drawing Sheet

OTHER PUBLICATIONS

Heyman et al., "Achieving Scalability in Parallel Reachability Analysis of Very Large Circuits," In CAV, 19 pages, May 30, 2000.

Jain, "On Analysis of Boolean Functions," Ph.D Dissertation, Dept. of Electrical and Computer Engineering, The University of Texas at Austin, 1993.

McMillan, "Symbolic Model Checking," Kluwer Academic Publishers, 1993.

Narayan et al., "Reachability Analysis Using Partitioned-ROBDDs," In Proc. of the Intl. Conf. on Computer-Aided Design, pp. 383-393, 1997.

Stern et al., "Parallelizing the Murphy Verifier," in CAV, pp. 1-12, 1997.

Stornetta et al., Implementation of an Efficient Parallel BDD Package,: In DAC, pp. 641-644, 50 pags, 1996.

Yang et al., "Parallel Breadth-First BDD Construction," In symposium on Principles and practice of parallel programming, pp. 145-146. ACM Press, 12 pages, 1997.

Cabodi et al., "Symbolic Exploration of Large Circuits with Enhanced Forward/Backward Traversals," In EuroDAC, 6 pages, 1994.

Cabodi et al., "Mixing Forward and Backward Traversals in Guided-Prioritized BDD-Based Verification," In CAV, pp. 471-484, 2002.

Chauhan et. al., "Non-Linear Quantification Scheduling in Image Computation," In ICCAD, 6 pages, 2001.

Clarke et al., "Design and Synthesis of Synchronization Skeletons Using Branching Time Temporal Logic," vol. 131 of LNCS, Unknown.

Govindaraju et al., "Verification by Approximate Forward and Backward Reachability," In ICCAD, 5 pages, 1998.

Iyer et al., "Improved Symbolic Verification Using Partitioning Techniques," In Proc. of CHAR ME, vol. 2860 of Lecture Notes in Computer Science, pp. 411-424, 2003.

Jain et. al., "Functional Partitioning for Verification and Related Problems," Brown/MIT VLSI Conference, 1992 [II] K. L. McMillan. Symbolic Model Checking. Kluwer Academic Publishers, 1993.

Moon et al., "To Split or to Conjoin: The Question in Image Computation," In DAC, 6 pages, 2000.

Somenzi., "UDD: CU Decision Diagram Package," ftp://vlsi.colorado.edulpub, 2001.

VIS. Verilog Benchmarks http://vlsi.colorado.edul- vis/, Unknown.

Wang et al., The Compositional Far Side of Image Computation. In ICCAD, 2003.

* cited by examiner

DIRECTED FALSIFICATION OF A CIRCUIT

RELATED APPLICATION

This Application claims the benefit, under 35 U.S.C. § 119(e), of U.S. Provisional Application No. 60/523,902, filed Nov. 20, 2003.

TECHNICAL FIELD

This disclosure relates generally to circuit verification and more particularly to directed falsification of a circuit.

BACKGROUND

Finding errors in hardware designs is a difficult problem that often requires searches based on binary decision diagrams (BDDs). However, current BDD approaches are typically unstable, inefficient, or both.

SUMMARY

The present invention may reduce or eliminate disadvantages, problems, or both associated with circuit verification.

In one embodiment, a method for directed falsification of a circuit includes selecting a partition of a state space of the circuit. The partition includes only a portion of the state space and is selected according to one or more results of one or more preimage calculations indicating one or more characteristics of the circuit. The characteristics indicate a likelihood that the partition includes one or more errors in the circuit. The method further includes, using one or more partitioned ordered binary decision diagrams (POBDDs), analyzing the partition according to a falsification-based forward-reachability technique to determine whether the partition includes one or more errors in the circuit.

Particular embodiments of the present invention may provide one or more technical advantages. As an example, particular embodiments use state-space partitioning in a parallel framework. In particular embodiments, multiple falsification algorithms executed independent of each other attempt, in parallel, to traverse search paths that are different from each other. Particular embodiments make full use of potential compactness resulting from partitioning and tend to smooth out variations in performance characteristic of using BDDs to detect errors in a circuit. In particular embodiments, parallel falsification obviates partition scheduling, which is typically a bottleneck in sequential falsification. Particular embodiments produce substantial performance gains over classical, as well as partitioned, BDDs. Particular embodiments of the present invention provide all, some, or none of the above technical advantages. Particular embodiments may provide one or more other technical advantages, one or more of which may be readily apparent to a person skilled in the art from the figures, description, and claims herein.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE DRAWINGS

Figure 1:
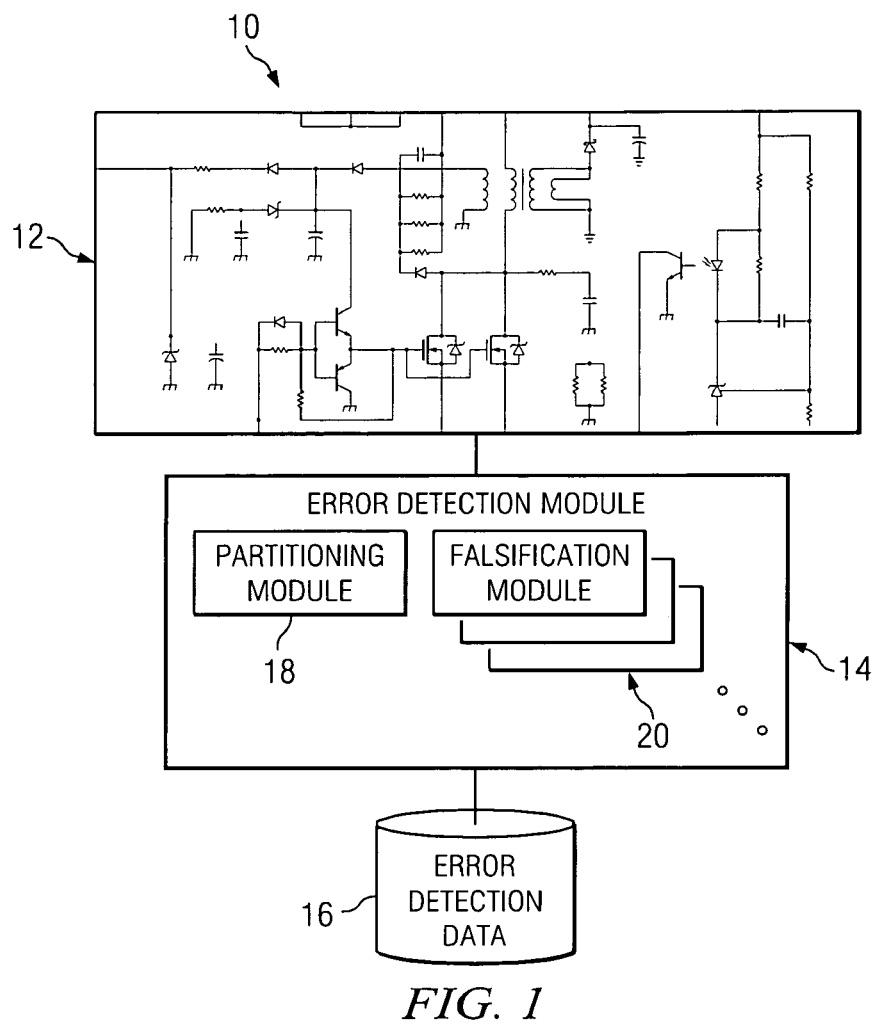
FIG. 1 illustrates an example system for directed falsification of a circuit.

FIG. 1 illustrates an example system 10 for directed falsification of a circuit 12. System 10 includes circuit 12 for directed falsification and an error detection module 14 and error detection data 16 for carrying out directed falsification on circuit 12, as described below. One or more links couple components of system 10 to each other. As an example and not by way of limitation, a link may include one or more wires in one or more circuit boards, one or more internal or external buses, one or more local area networks (LANs), one or more metropolitan area networks (MANs), one or more wide area networks (WANs), one or more portions of the Internet, or a combination of two or more such links, where appropriate.

Circuit 12 includes hardware or a logical or other representation of hardware for testing to determine whether the hardware operates properly, e.g., according to one or more particular specifications corresponding to the hardware. As an example and not by way of limitation, circuit 12 may include circuit components such as gates, counters, inverters, buffers, and other circuit components arranged and coupled to each other to provide particular functionality. As another example, circuit 12 may include a logical or other representation of such components. Circuit 12 may include millions of circuit components. To provide a particular functionality, circuit 12 may need to include one or more properties. Circuit 12 may need to include millions of such properties. In particular embodiments, one or more logical expressions may describe a property of circuit 12. Reference to a "property" of circuit 12 may encompass a logically expressible state, characteristic, behavior, or operation of circuit 12 or another property of circuit 12.

Error detection module 14 includes a hardware, software, or embedded logic component or a combination of two or more such components for accessing circuit 12 via one or more links and detecting errors in circuit 12. In particular embodiments, detecting errors in circuit 12 includes testing circuit 12 to determine whether circuit 12 includes one or more particular properties. As an example and not by way of limitation, testing circuit 12 to determine whether circuit 12 includes one or more particular properties may include identifying states in circuit 12, as described below. Error detection module 14 includes a partitioning module 18 and one or more falsification modules 20. Partitioning module 18 includes a hardware, software, or embedded logic component or a combination of two or more such components for partitioning a state space of circuit 12, as described below. A state space of circuit 12 includes all or substantially all states of circuit 12. A partition of a state space of circuit 12 includes one or more portions of the state space of circuit 12. Falsification modules 20 each include a hardware, software, or embedded logic component or a combination of two or more such components for applying a falsification algorithm using POBDDs to a partition of a state space of circuit 12, as described below. Error detection data 16 includes data specifying a type of circuit 12 and other data that, in particular embodiments, error detection module 14 uses to detect errors in circuit 12. In particular embodiments, one or more computer systems provide user access to error detection module 14 and error detection data 16. As an example and not by way of limitation, one or more computer systems may include error detection module 14 and error detection data 16 and a user may access the one or more computer systems to provide input to and receive output from error detection module 14 and error detection data 16.

Falsification is detection of an erroneous state in an erroneous circuit 12. More precisely: given property p, falsification is detection of false states $s_p$ where p is violated, which is a dual of verification. Reference to an erroneous state in a circuit 12 encompasses a state in circuit 12 related to improper functioning of circuit 12, where appropriate. Previous verification algorithms attempt to efficiently cover reachable state space of a circuit 12 to show an absence of erroneous states. However, if circuit 12 includes errors, detection of an error state is often more efficient than attempting to exhaustively traverse reachable state space of the circuit. Reference to an error in a circuit 12 encompasses one or more erroneous states in circuit 12, where appropriate.

Two widely used falsification algorithms are (1) Bounded Model Checking (BMC) using Satisfiability (SAT) solvers and (2) symbolic reachability and model checking using BDDs. BMC represents states as clauses and uses an SAT solver to find a path from a set of one or more initial states to a set of one or more errors. To find a path from a set of one or more initial states to a set of one or more errors, BMC repeatedly unrolls a transition relation (TR) of a state graph corresponding to a circuit 12 and coverts the TR to clauses. As a result, BMC only works well at detecting relatively shallow errors (which include errors having relatively short paths to them). To detect a deep error, BMC must generate large numbers of clauses, which tends to make subsequent SAT checking unfeasible.

Errors may lie relatively deep in a circuit 12. As an example and not by way of limitation, a hardware implementation of an Ethernet switch may carry out initialization over a relatively large number of timeframes. One or more properties of a circuit 12 embodying the hardware implementation of the Ethernet switch would necessarily lie deeper than the initial setup phase. BMC would likely be ineffective at detecting errors deeper than the initial setup phase. A reachability analysis of circuit 12 using BDDs may be an alternative to BMC. Various counter-like circuits 12 are "BDD friendly" in the sense that such circuits 12 have compact BDD representations, but lead to a substantially unmanageable number of SAT clauses. The "B12" circuit 12 from the VIS-Verilog Benchmark suite is an example of such a circuit 12. Accordingly, in various scenarios, BMC is inadequate and error detection using BDDs is needed. As described below, particular embodiments improve on falsification using BDDs.

A symbolic reachability analysis includes a Breadth First Search (BFS) using symbolic data structures, which are usually BDDs. Symbolic reachability for verification attempts to explore all reachable states and show an absence of erroneous states. If an erroneous state is reachable, then a path leading to the error may be found.

State-space explosion is a significant problem in reachability analyses. As a size of a circuit 12 grows, a state space of circuit 12 may grow exponentially along with the size of circuit 12. Because BDDs are symbolic representations of state sets, sizes of BDDs corresponding to circuit 12 may in turn become very large, at which point working with the BDDs may become cumbersome and memory-intensive. In addition, even if the sizes of the BDDs are only moderately large, if an error lay deep in circuit 12, reaching the error would require many steps of reachability. Such a situation would tend to slow down a reachability analysis of circuit 12 using BDDs and render the analysis ineffective. Monolithic ordered BDDs (OBDDs) are generally inefficient representations. Using functional partitioning to generate partitioned OBDDs (POBDDs) may significantly reduce a size of such a representation.

Moreover, OBDDs tend to be unstable. Performance of OBDDs is generally sensitive to selected values of variables used to generate and process the OBDDs. As an example and not by way of limitation, variable ordering often plays a key role in determining sizes of OBDDs. Even slight changes in settings of a few variables may yield significant fluctuations in memory requirements associated with the OBDDs, which may in turn affect time requirements associated with processing the OBDDs. POBDDs tend to be even more unstable than OBDDs, since performance of POBDDs is sensitive to various partitioning factors as well.

BMC is ineffective at detecting deep errors through falsification. Because previous reachability algorithms using OBDDs are globally breadth first, such algorithms are ineffective at detecting deep errors. Particular embodiments tend to smooth out instability typically associated with POBDDs. Because POBDDs provide compact representations and because partitioned reachability algorithms are locally (and not globally) breadth first, falsification using POBDDs tends to be more effective at locating deep errors in circuits 12. However, because POBDDs are sensitive to selected values of variables for generating the POBDDs, practical application of POBDDs tends to be limited. In particular embodiments, searches using POBDDs tuned for falsification include multiple traversals of a state space of a circuit 12. The multiple traversals run parallel to each other, independent of each other, and include search paths that are different from each other. In particular embodiments, falsification modules 20 may each carry out one of the multiple traversals.

Determining a suitable schedule for processing multiple partitions using POBDDs tends to be difficult. An unsuitable schedule will render serial processing of the multiple partitions inefficient. To obviate determining a suitable schedule for processing multiple partitions using POBDDs, particular embodiments carry out falsification using POBDDs using multiple searches of state space that are parallel to each other. Particular embodiments carry out falsification using POBDDs simultaneously using both serial searches of state space and searches of state space that are parallel to each other. In particular embodiments, a reachability algorithm includes a breadth-first traversal of finite state machines. Inputs to the reachability algorithm are a set of initial states and a TR relating to current states next states reachable from the current states. To determine the reachable states, the reachability algorithm repeatedly computes images until the reachability algorithm reaches a fixed point Particular embodiments use POBDDs to improve verification based on reachability. As an example and not by way of limitation, a reachability algorithm using POBDDs may include the following example logic

```
POBDD-Reachability (TR, InitStates){
    Initialize Rch to InitStates
    Create partitioned rep for Rch
    do {
        for (each partition i)
            Calculate LeastFixedPoint(Rch) in i
        for (each pair of partitions i and j)
            Compute cross-over states from i to j
        Add all new states to Rch
    } until (No new state is added to Rch);
}
```

In particular embodiments, the above reachability algorithm carries out as many image computations as possible in each partition i in each step of LeastFixedPoint. When the reachability algorithm cannot compute any more images, the reachability algorithm synchronizes the partitions with each other. To synchronize the partitions with each other, the reachability algorithm considers the transitions in each partition i leading out of partition i.

The above reachability algorithm using POBDDs is not a strict BFS traversal. The reachability algorithm performs a BFS local to each individual partition and then synchronizes the partitions with each other to add states that result from transitions crossing over from one partition to another. Thus, in particular embodiments, the reachability algorithm applies regional BFSs in which individual regions of a state space, i.e., the partitions, are traversed independent of each other breadth first. Such traversal of state space may significantly improve falsification. When BDDs are used to traverse a state space breadth first, performance of the BDDs is sensitive to values assigned to various variables for generating and processing the BDDs. Such sensitivity tends to arise from differences in sizes of the BDDs. During reachability, the BDDs cover sets of states that are similar to each other.

A typical reachability analysis using POBDDs does not carry out conventional BFSs. Traversals of a state space using POBDDs differing from each other (even slightly) with respect to their partitioning factors tend to result in partitions of the state space that are different from each other. Such traversals often traverse states in the state space in orders that are different from each other. A size of a graph may also vary according to values assigned to partitioning variables used to generate the graph, since POBDDs tends to provide compact representations. Such potential for compactness and potential for variation in paths for traversing state space exacerbates sensitivity of reachability analyses using POBDDs to settings used to run such analsyses.

A sequence according to which a reachabilty algorithm using POBDDs for falsification explores partitions affects performance of the reachability algorithm. Exploring partitions without erroneous states before exploring partitions with erroneous states tends to delay discovery of the erroneous states, and an erroneous state in a first partition may be easier to reach than an erroneous state in a second partition. As a result, being able to discover an erroneous state often depends on a schedule for exploring partitions. Because falsification expects to locate errors and verification explores state spaces to show absences of errors, scheduling tends to present a problem in reachability algorithms for falsification, but does not present a similar problem in reachability algorithms for verification.

Particular embodiments use two measures of distribution of erroneous states. A first measure is a length of a shortest path leading to a reachable erroneous state from a set of initial states, which is depth d. A BFS up to depth d would discover this error. A shallow bug has a closest reachable error with a small value of d, and a deep bug has a closest reachable error with a large value of d. A second measure is a frequency of occurrence of reachable erroneous states in one or more partitions. A partition including a reachable erroneous state is a witness partition. Interplay between the first measure and the second measure results in four possible scenarios:

Scenario 1: Many witness partitions for shallow bug. Many methods, including testing and simulation, would likely catch the error.

Scenario 2: Few witness partitions for shallow bug. Methods that traverse state space using BFSs, e.g., OBDDs and SAT BMC, would likely catch the error.

Scenario 3: Many witness partitions for deep bug. Many methods experience difficulty going deep into a circuit 12 and are able to explore circuit 12 at only shallow depths. Reachability analyses using POBDDs that apply BFSs to state space tend to reach deeper states in less time. Erroneous states in certain partitions may be more reachable than erroneous states in other partitions.

Scenario 4: Few witness partitions for deep bug. Scenario 4 is a difficult scenario for formal verification. As described above, varying partition order and selection of values for variables for generating and processing POBDDs may greatly vary results. One or more first traversals may locate the error much faster than one or more second traversals, which adds to potential instanbility in performance.

As described above, performance of a reachabilty algorithm for falsification using POBDDs to locate errors deep in a circuit depends on an order according to which the reachability algorithm processes partitions and how the reachability algorithm traverses state space. Particular embodiments use parallelization to address such performance issues. In particular embodiments, multiple falsification algorithms running in parallel at falsification modules 20 enable traversal of state space along search paths that are different from each other, which facilitates rapid discovery of erroneous states and reduces sensitivity of POBDDs to settings. Discovering erroneous states using falsification depends on an order according to which states are explored. Certain traversals of state space may discover erroneous states faster than a strict BFS. Since a distribution of erroneous states is unknown a priori, determining one or more efficiect seach paths is difficult.

In particular embodiments, because POBDDs provide compact representations and because POBDDs are sensitive to values assigned to variables used to generate and process the POBDDs, multiple falsification modules 20 each traverse, in parallel, a partition of a state space of a circuit 12 using POBDDs. Falsification modules 20 all discontinue their traversals when a falsficiation module 20 locates an erroneous state. As described above, falsification modules 20 include processors that operate parallel to each other and run independent of each other. Because falsification modules 20 include processors that operate parallel to each other and run independnet of each other, falsification modules 20 may each use local memory to traverse a partition of the state space of circuit 12.

In particular embodiments, partitioning module 18 generates relatively small partitions of a state space of a circuit 12 to simplify a fixed-point computation in each partition. As a result of partitioning module 18 generating relatively small partitions, partitioning module 18 generates a relatively large number of partitions. A smaller partition enables the example reachability algorithm using POBDDs described above to penetrate deeper into the partition, which enables the reachability algorithm to locate erroneous states lying deeper in circuit 12 that correspond to scenario 3 and possibly scenario 4, above.

In particular embodiments, error detection module 14 process partitions of a state space of circuit 12 in parallel. A falsification module 20 processes one of the partitions independent of the other partitions and reaches into the parititon as far as possible. Error detection module 14 may synchronize two or more partitions with each other. In particular embodiments, error detection module 14 uses one or more shared memories for synchronization to reduce overhead otherwise associated with handling different memories at different processors. Processing partitions of a state space of circuit 12 in parallel distributes work associated with detecting errors in circuit 12 and obviates scheduling partitions for processing.

As an example and not by way of limitation, assume N partitions. Also assume execution of the partitions at independent processors, e.g., falsification modules 20, using a shared-memory model. Also assume for simplicity that enough processors are available to execute the partitions in parallel and that use of the processors incurs no real overhead. Let time to fully explore partition i be $t_i$. Thus, total time to fully explore a state space including the N partitions is $\Sigma t_i$ using a sequential approach and $\max(t_i)$ when executing in parallel. For falsification, once an error is found, the algorithm stops. Let $e_i$ be time taken to locate an erroneous state in partition i. Then $e_i \leq t_i$, with equality occurring when partition i includes no erroneous states. Suppose the N partitions are scheduled such that the first j-1 partitions have no error and j has an erroneous state. Then time taken by a sequential approach is $$e_j + \sum_{i=1}^{j-1} t_i.$$

When all partitions execute in parallel, each partition executes until an earliest error state is detected. Time taken for total work is bounded by $N^* \min_j e_j$, and time perceived by the user is further reduced to $\min_j e_j$. Note that this time, $\min_j e_j$, is smaller than the total sequential time, $$e_j + \sum_{i=1}^{j-1} t_i,$$

and gain may be superlinear with respect to the number of parallel processors. In comparison to the sequential execution, the parallel setup can provide a dramatic gain, suggesting that POBDD can be suitable for fast falsification. Also, in the sequential case partitions that have no error may be explored unnecessarily. Even when an error is detected, it may not be in the partition where it is easiest to reach. The parallel case has an advantage in that it needs no such ordering, and it gets to the error state quickest to reach.

In particular embodiments, a falsification module 20 includes a 2.2 GHz, dual-processor XEON central processing unit (CPU) with 512 MB of main memory. Particular embodiments implement a falsification module 20 (or one or more components of error detection module 14) on top of VIS 2.0 using a University of Colorado Decision Diagram (CUDD) BDD package. Particular embodiments use a lazy sift for variable reordering. In particular embodiments, all failing invariants on circuits 12 in the VIS-Verilog benchmark suite are considered for falsification. Such embodiments tend to show variations in time required for falsification using OBDDs and POBDDs when critical BDD parameters vary over a small number of runs. POBDDs are receptive to larger sets of variables, many of which are not available to methods using OBDDs. However, more runs would generate more data, which could compromise a quality of presentation. An equal and small number of runs may be analyzed for both methods.

A readily changeable variable in reachability algorithms using OBDDs is cluster size of a partitioned TR. As an example and not by way of limitation, a user may vary cluster size from 100 to 5000, e.g., 100, 200, 500, 2500, and 5000. A baseline setting, with which results are compared for variation, may have a cluster size of 2500, which is approximately an average of extreme values. Another readily changeable variable is a threshold for introduction of temporary variables. A user may leave the threshold unvaried. Despite variation in parameters, each traversal using OBDDs may remain strictly BFS. An order according to which error detection module 14 traverses states using POBDDs varies according to variable settings. Particular embodiments include two sets of variables. A first set includes variables corresponding to data structure representation, such as, for example, partitioning variables, and number of partitions. Variables in a second set relate to reachability, such as, for example, a cluster size of a TR, a schedule for processing partitions, when to initiate partitioning, and dynamic partitioning thresholds. To limit POBDDs to a same number of runs as OBDDs (such as, for example, five) a user may vary only a limited number of variables. In particular embodiments, a user varies only a choice of partitioning variables and a cluster size of a TR. In particular embodiments, for each run, partitioning module 18 uses four partitioning variables to generate sixteen initial partitions.

In particular embodiments, for a first three runs, reachability variables are fixed, e.g., a TR cluster size is set to a previous baseline value of 2500. The following choices of partitioning variables are tried: variables in an OBDD variable ordering list; variables from a TR analysis; and variables from a similar analysis using a state-set graph. In particular embodiments, a user varies no other partitioning variables. For a last two runs, all partitioning variables are fixed and reachability parameters are varied. A first partitioning choice above and cluster sizes 200 and 500 are used, skipping extremes in cluster size.

In particular embodiments, the OBDD results fluctuate only moderately with changes in variable settings. The POBDD results often include variations including many orders of magnitude. As a result, partitioning is sensitive to its settings. In addition, no single choice of variable setting is able to complete all falsification properties in a VIS benchmark suite. Each setting may be essential for one or more circuits. For some circuits, none of the OBDD-based runs finds the error. However, the POBDD-based runs, when considered together, are able to falsify all the properties. POBDD runs also tend to show wider ranges of behavior. Particular embodiments provide an automatic method which tries various settings in parallel and rejects inefficient cases. Particular embodiments implement such a method making multiple traversals in parallel and, when any one finishes, terminating the rest. Particular embodiments apply such a method to falsification using OBDDs as well as POBDDs.

In particular embodiments, a parallel search of multiple partitions finds an erroneous state quickest to reach. Further, for some circuits 12, no settings may be provide a most efficient set of settings. In particular embodiments, however, a parallel run does not need any scheduling and can therefore reach an erroneous state faster. Particular embodiments address the problem of finding errors that are far from initial states through an unguided automatic approach which exploits partitioning using POBDDs and a parallel framework. Particular embodiments include a two-pronged solution. First, multiple independent falsification algorithms traverse, in parallel, different search paths, unlike existing approaches that rely predominantly on BFS. Having multiple independent falsification algorithms traverse, in parallel, different search paths reduces sensitivity of falsification to BDD parameters and improves overall stability. Second, parallel search of state space obviates partition scheduling, which is often a bottleneck in a sequential approaches to falsification. In particular embodiments, parallelizing even on a small scale may provide gains of two orders of magnitude.

Particular embodiments provide directed falsification using partitioning-oriented approaches, which may include an automatic method for finding bugs or other errors in a circuit using partitioning techniques. Mathematically, falsification ("Is property P erroneous?") is simply a negation of verification ("Is property P correct?"), but in practice falsification is typically a key problem in design validation. Many property-based verification tools attempt some type of falsification, because often, in practice, a sufficient set of properties often does not exist; only a necessary set exists. Therefore, focusing on falsification is not impractical. Simulation is often used because of its use in falsification. However, simulation is typically weak for purposes of exploring large state spaces and previous formal verification (FV) techniques are inadequate for purposes of exploring deep or difficult functions. In this context, partitioned ordered binary decisions diagrams (POBDDs) may facilitate falsification, since POBDDs are based on Depth First Search (DFS) analysis of a circuit.

POBDDs can be used to reach deep states relatively fast, since POBDDs are based on DFS analysis. However, such techniques may fail if an error is not uniformly distributed or if the error has short paths from partitions of low density. Particular embodiments determine the pattern of state space that should be traversed to reach one or more erroneous states (if there are any) and decide the direction of depth-first analysis, according to particular needs. Particular embodiments may also carry a map of states useful for reaching one or more erroneous states (even if the erroneous states occur in other partitions) and trap erroneous witnesses, according to particular needs.

In particular embodiments, a method works as DFS, followed by BFS and then by guided traversal. Accordingly, the method may benefit from information generated at each phase. The method may operate in the DFS phase by computing a POBDD structure without accompanying monolithic computation. In the second phase, a small monolithic computation may be carried out until the computation exhibits difficulty. In the third stage, a preimage may be computed from possible erroneous states until BDD blow-up occurs. The blow-up definition may be kept so that it does not affect future set-intersection operations or create BDD computation overhead. This information may be computed and passed to the method from a preceding BFS run, which may facilitate efficiency in the method. This step may facilitate efficient determination of a probability distribution (or map) of erroneous witnesses and their preimages, which may provide an erroneous terrain. This terrain may then be efficiently mapped to one or more partitions, and this information may be used to determine one or more partitions in which a DFS search should be conducted. However, during the communication, remaining partitions will be touched. At that stage, the method may calculate an intersection of erroneous terrain with computed states. At the first intersection, the method may terminate, since the error will have been detected. Particular embodiments may substantially reduce time requirements associated with falsification-based verification techniques. In particular embodiments, such gains may be on the order of 10× to 100× (relative to previous techniques).

Figure 2:
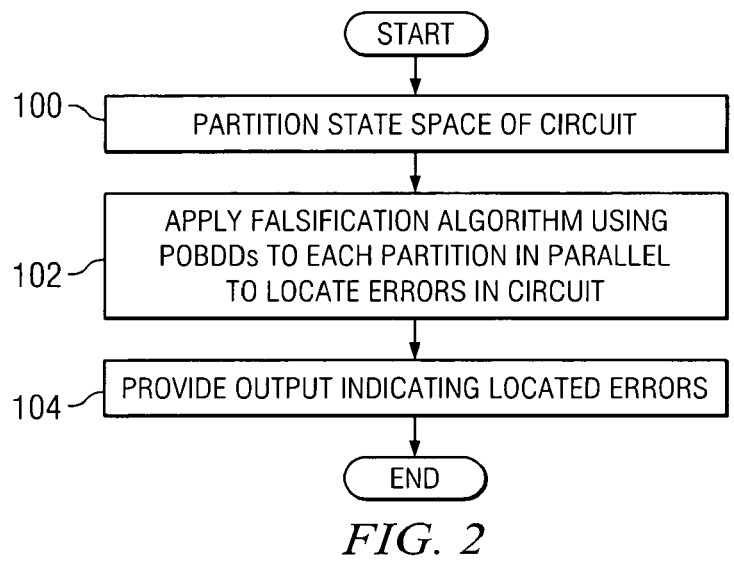
FIG. 2 illustrates an example method for directed falsification of a circuit.

FIG. 2 illustrates an example method for directed falsification of a circuit 12. The method begins at step 100, where error detection module 14 accesses circuit 12 and, using partitioning module 18, partitions a state space of circuit 12 for falsification using POBDDs. At step 102, falsification modules 20 each apply a falsification algorithm using POBDDs to a partition of the state space, in parallel, to locate errors in circuit 12. As described above, in particular embodiments, if any one of falsification modules 20 locates an error, all falsification modules 20 discontinue traversal of the state space. At step 104, error detection module 14 provides output indicating one or more located errors, if any, in circuit 12, for communication to one or more users, at which point the method ends.

Although this disclosure has been described in terms of certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. A method for directed falsification of a circuit, the method comprising:
   selecting one or more partitions of a state space of the circuit, the one or more partitions each comprising only a portion of the state space and being selected according to one or more results of one or more preimage calculations indicating one or more characteristics of the circuit, the characteristics indicating a likelihood that the partition comprises one or more errors in the circuit; and
   using one or more partitioned ordered binary decision diagrams (POBDDs), analyzing the one or more partitions according to a falsification-based forward-reachability technique to determine whether the one or more partitions comprise one or more errors in the circuit.

2. The method of claim 1, wherein analyzing the one or more partitions according to the falsification-based forward-reachability technique comprises running a breadth-first search (BFS) in the one or more partitions.

3. The method of claim 1, further comprising:
   selecting a plurality of partitions of the state space of the circuit; and
   using one or more POBDDs, analyzing each of the plurality of partitions independent of each other in parallel according to a falsification-based forward-reachability technique to determine whether any of the plurality of partitions comprises one or more errors in the circuit.

4. The method of claim 3, wherein a first analysis of a first one of the plurality of partitions comprises a first search path unique with respect to one or more second search paths in one or more second analyses of one or more second ones of the plurality of partitions.

5. The method of claim 3, wherein each analysis of one of the plurality of partitions comprises using a local memory to traverse the partition.

6. The method of claim 3, further comprising, if an analysis of one of the plurality of partitions detects an error in the circuit, terminating all analyses of the plurality of partitions.

7. The method of claim 3, further comprising, if a first analysis of a first one of the plurality of partitions reaches a fixed point, synchronizing the first one of the plurality of partitions with one or more second ones of the plurality of partitions one or more second analyses of which have also reached fixed points.

8. The method of claim 7, further comprising using a shared memory to synchronize the first one of the plurality of partitions with the one or more second ones of the plurality of partitions.

9. The method of claim 1, wherein the one or more selected partitions of the state space of the circuit comprise a size enabling analysis of the one or more partitions to reach one or more deep states in the one or more partitions.

10. The method of claim 1, wherein a central processing unit (CPU) comprising two processors carries out the analysis of the one or more partitions according to the falsification-based forward-reachability technique to determine whether the one or more partitions comprise one or more errors in the circuit.

11. Logic for directed falsification of a circuit, the logic stored in a computer storage medium and when executed operable to:

select one or more partitions of a state space of the circuit, the one or more partitions each comprising only a portion of the state space and being selected according to one or more results of one or more preimage calculations indicating one or more characteristics of the circuit, the characteristics indicating a likelihood that the partition comprises one or more errors in the circuit; and using one or more partitioned ordered binary decision diagrams (POBDDs), analyze the one or more partitions according to a falsification-based forward-reachability technique to determine whether the one or more partitions comprise one or more errors in the circuit.

12. The logic of claim 11, further operable to running a breadth-first search (BFS) in the one or more partitions to analyze the one or more partitions according to the falsification-based forward-reachability technique.

13. The logic of claim 11, further operable to:

select a plurality of partitions of the state space of the circuit; and using one or more POBDDs, analyze each of the plurality of partitions independent of each other in parallel according to a falsification-based forward-reachability technique to determine whether any of the plurality of partitions comprises one or more errors in the circuit.

14. The logic of claim 13, wherein a first analysis of a first one of the plurality of partitions comprises a first search path unique with respect to one or more second search paths in one or more second analyses of one or more second ones of the plurality of partitions.

15. The logic of claim 13, wherein each analysis of one of the plurality of partitions comprises using a local memory to traverse the partition.

16. The logic of claim 13, further operable, if an analysis of one of the plurality of partitions detects an error in the circuit, to terminate all analyses of the plurality of partitions.

17. The logic of claim 13, further operable, if a first analysis of a first one of the plurality of partitions reaches a fixed point, to synchronize the first one of the plurality of partitions with one or more second ones of the plurality of partitions one or more second analyses of which have also reached fixed points.

18. The logic of claim 17, further operable to use a shared memory to synchronize the first one of the plurality of partitions with the one or more second ones of the plurality of partitions.

19. The logic of claim 11, wherein the one or more selected partitions of the state space of the circuit comprise a size enabling analysis of the one or more partitions to reach one or more deep states in the one or more partitions.

20. The logic of claim 11, further comprising a central processing unit (CPU) comprising two processors for carrying out the analysis of the one or more partitions according to the falsification-based forward-reachability technique to determine whether the one or more partitions comprise one or more errors in the circuit.

21. A system for directed falsification of a circuit, the system comprising:

means for selecting one or more partitions of a state space of the circuit, the one or more partitions each comprising only a portion of the state space and being selected according to one or more results of one or more preimage calculations indicating one or more characteristics of the circuit, the characteristics indicating a likelihood that the partition comprises one or more errors in the circuit; and means for, using one or more partitioned ordered binary decision diagrams (POBDDs), analyzing the one or more partitions according to a falsification-based forward-reachability technique to determine whether the one or more partitions comprise one or more errors in the circuit.

* * * * *